(12) United States Patent
Terai et al.

(10) Patent No.: US 11,267,237 B2
(45) Date of Patent: Mar. 8, 2022

(54) SUBSTRATE BONDING APPARATUS

(71) Applicant: Kioxia Corporation, Tokyo (JP)

(72) Inventors: Hayato Terai, Mie (JP); Manabu Takakuwa, Tsu (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/011,890

(22) Filed: Sep. 3, 2020

(65) Prior Publication Data
US 2021/0078317 A1  Mar. 18, 2021

(30) Foreign Application Priority Data

Sep. 12, 2019 (JP) .............. JP2019-166284

(51) Int. Cl.
| | |
|---|---|
| *B32B 37/10* | (2006.01) |
| *B32B 38/18* | (2006.01) |
| *B32B 38/00* | (2006.01) |
| *B23K 20/02* | (2006.01) |
| *B29C 65/00* | (2006.01) |
| *H01L 21/67* | (2006.01) |
| *H01L 21/683* | (2006.01) |

(52) U.S. Cl.
CPC ......... *B32B 38/1858* (2013.01); *B23K 20/02* (2013.01); *B29C 66/306* (2013.01); *B32B 37/10* (2013.01); *B32B 38/145* (2013.01); *H01L 21/67092* (2013.01); *H01L 21/67282* (2013.01); *H01L 21/6838* (2013.01); *H01L 2924/00* (2013.01)

(58) Field of Classification Search
CPC .......... H01L 21/67282; H01L 2924/00; B29C 66/306; B32B 37/10; B32B 38/145
See application file for complete search history.

(56) References Cited

U.S. PATENT DOCUMENTS

| | | | | |
|---|---|---|---|---|
| 5,838,361 | A * | 11/1998 | Corbett ................. | B41M 5/267 347/262 |
| 9,586,391 | B2 | 3/2017 | Hayashi et al. | |
| 2012/0193009 | A1 | 8/2012 | Fujii | |
| 2018/0047699 | A1 | 2/2018 | Omori et al. | |
| 2019/0105850 | A1 * | 4/2019 | Oates ................... | B29C 65/526 |
| 2019/0385971 | A1 | 12/2019 | Omori et al. | |

FOREIGN PATENT DOCUMENTS

| | | |
|---|---|---|
| JP | 2012-160628 A | 8/2012 |
| JP | 2014-209571 A | 11/2014 |
| JP | 2017-84999 A | 5/2017 |
| JP | 2018-26414 A | 2/2018 |
| JP | 2018-26415 A | 2/2018 |

* cited by examiner

*Primary Examiner* — Scott W Dodds
(74) *Attorney, Agent, or Firm* — Oblon, McClelland, Maier & Neustadt, L.L.P.

(57) ABSTRACT

According to one embodiment, there is provided a substrate bonding apparatus including a first suction stage, a second suction stage, and a pressing member. The first suction stage sucks a first substrate. The second suction stage is arranged so as to face the first substrate. The second suction stage sucks the second substrate. The pressing member is capable of deforming the first substrate sucked on the first suction stage so as to be convex toward the second suction stage side. The pressing member has a marking structure on a distal end side.

13 Claims, 12 Drawing Sheets

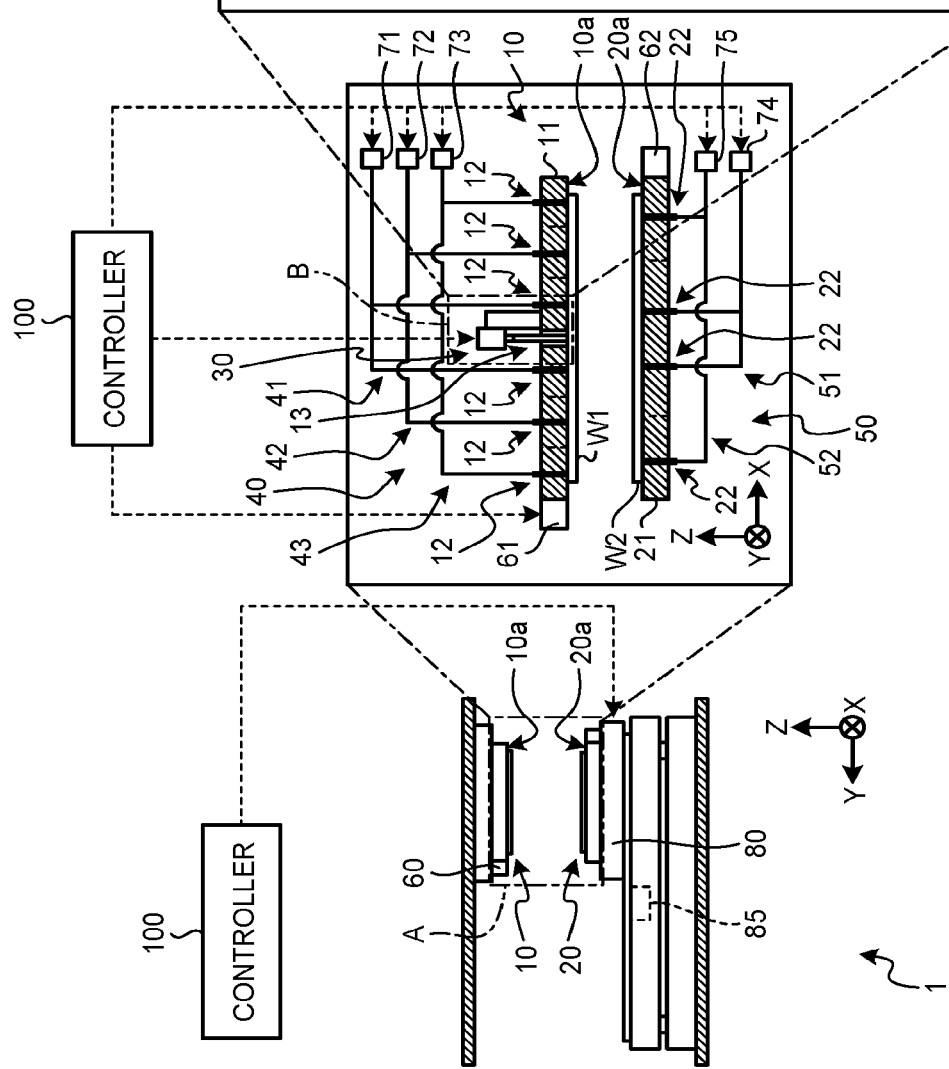

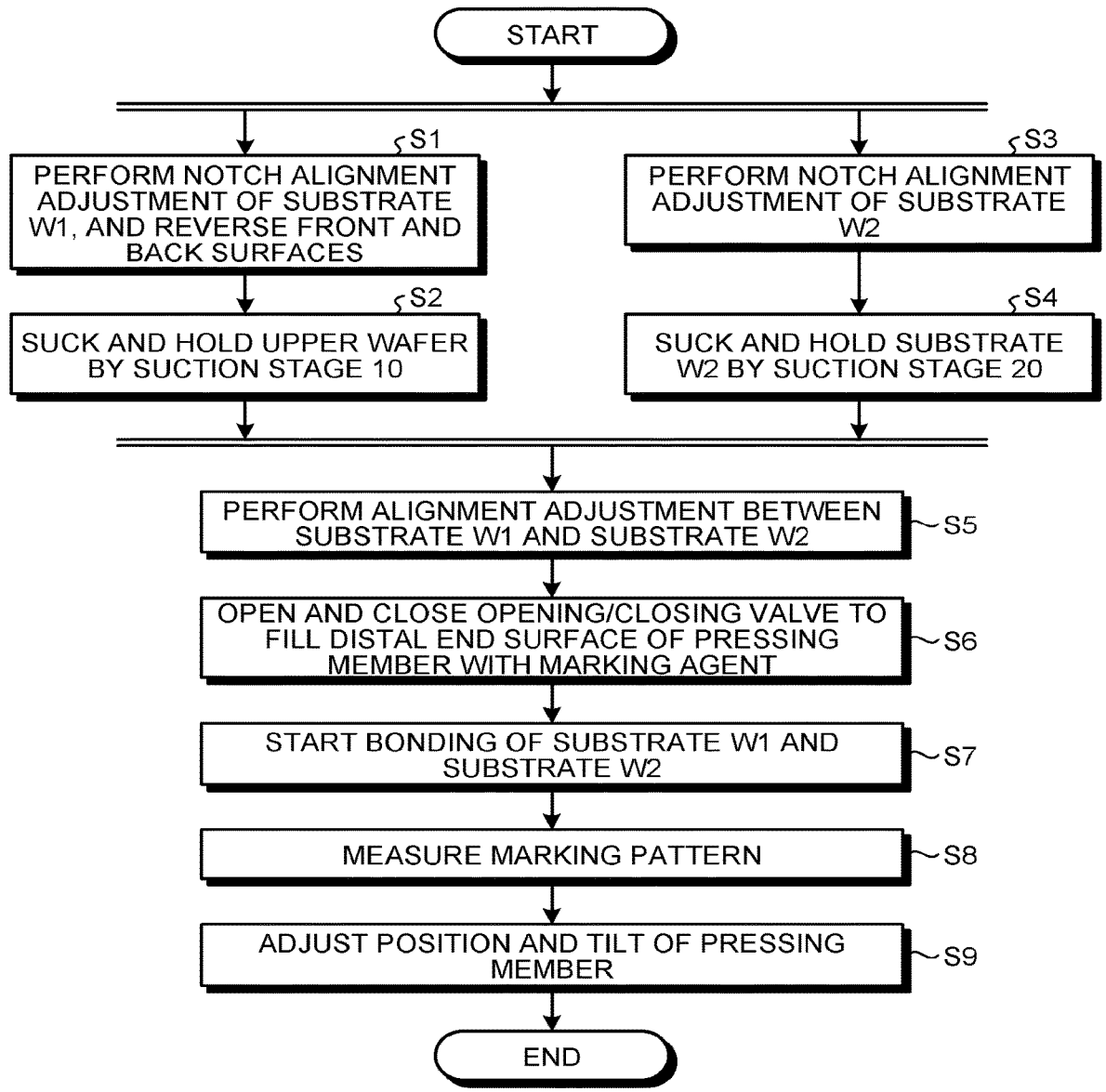

FIG.8A
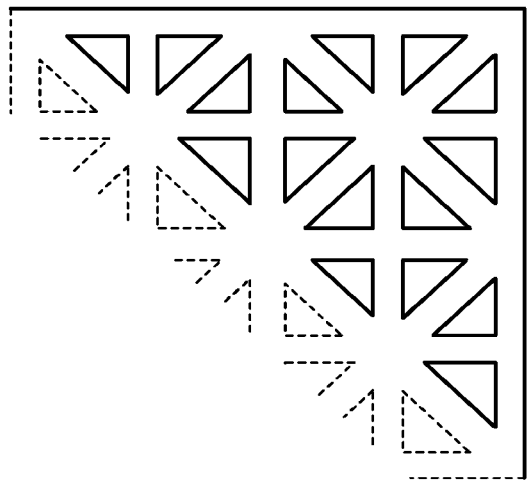
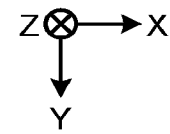
FIG.8B
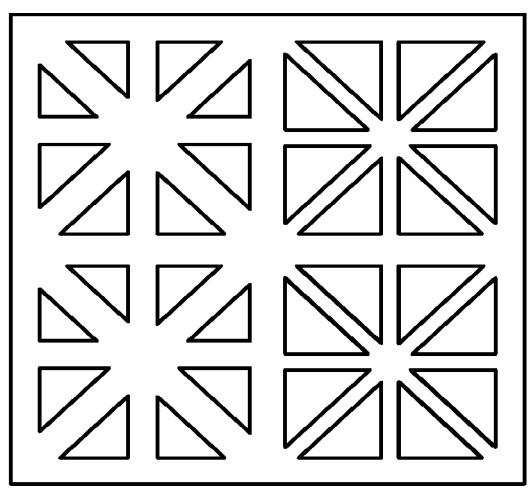
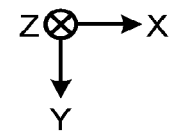

FIG.9A
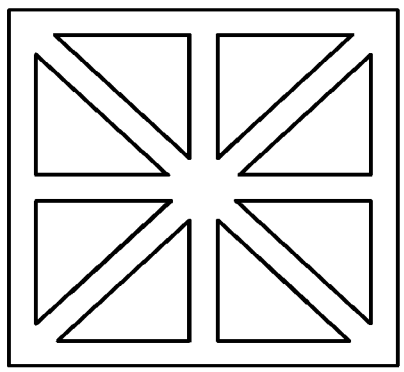
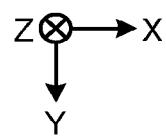
FIG.9C
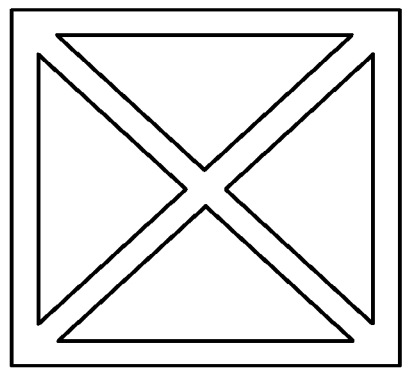
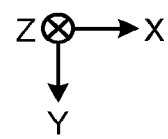
FIG.9B
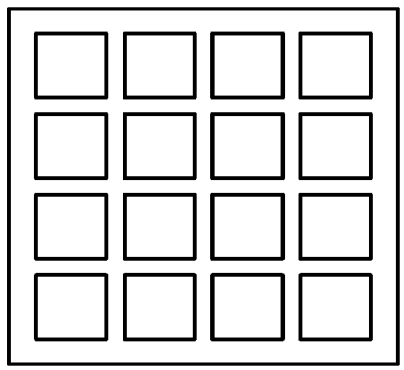
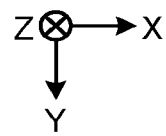
FIG.9D
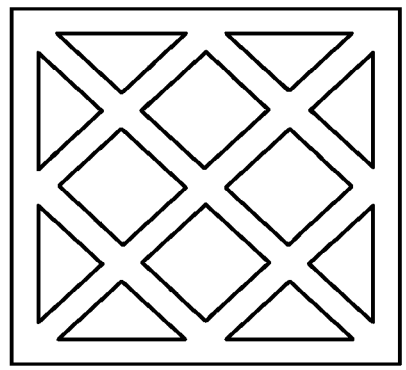
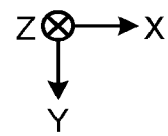

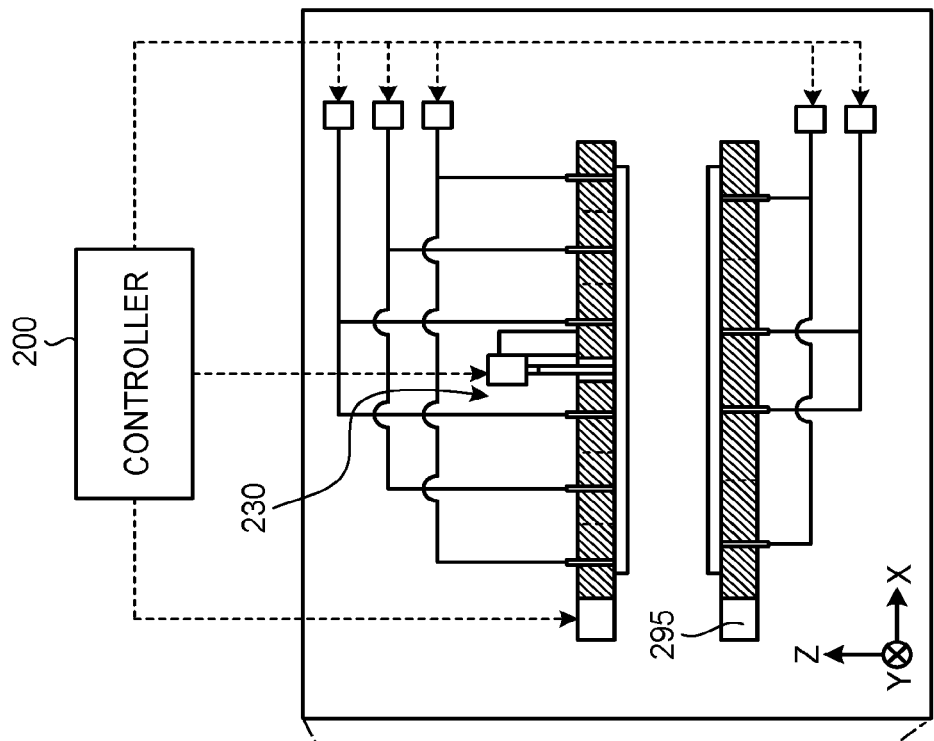
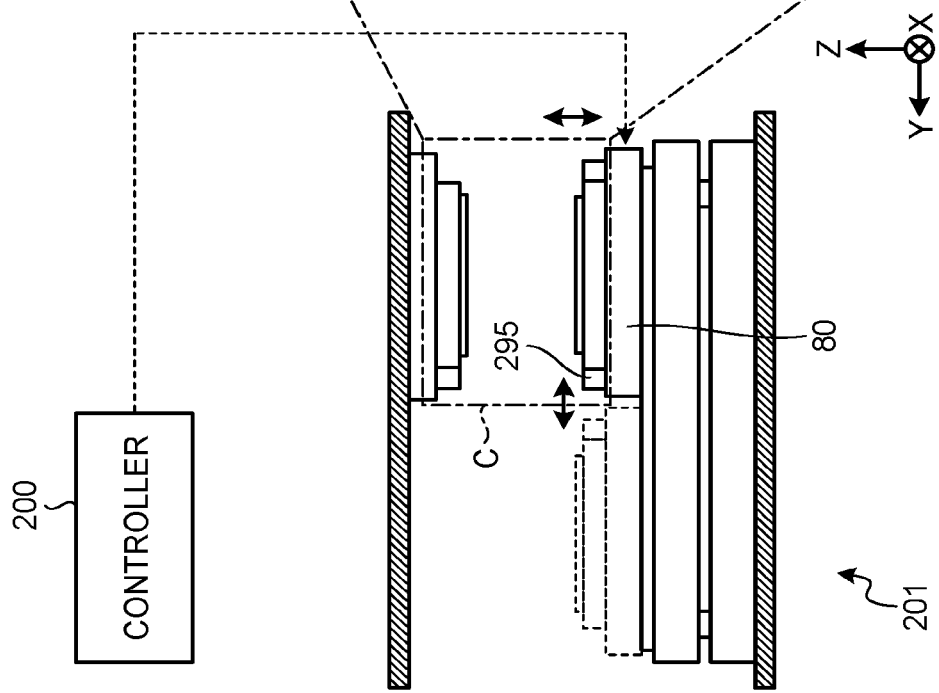

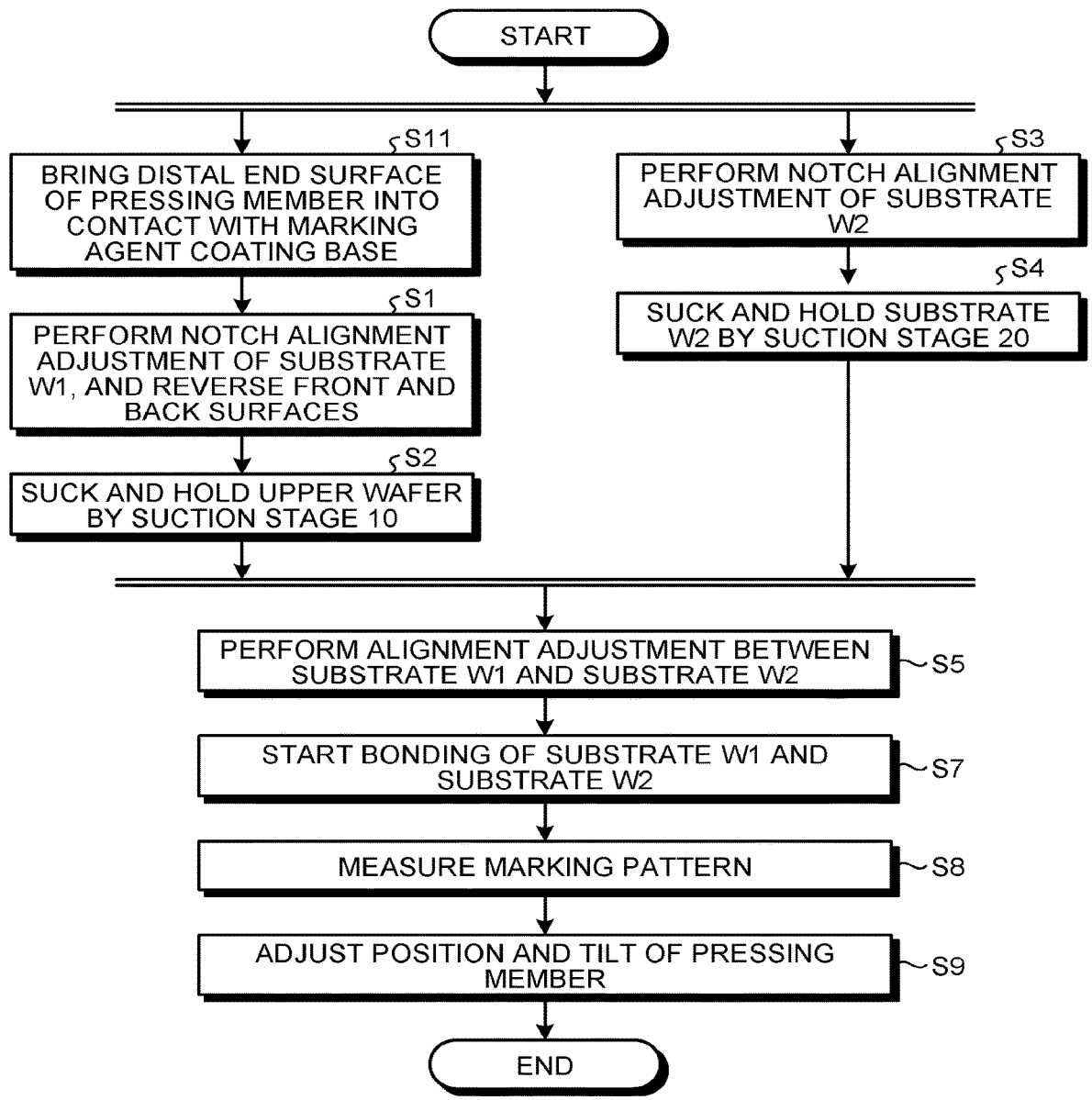

SUBSTRATE BONDING APPARATUS

CROSS-REFERENCE TO RELATED APPLICATIONS

This application is based upon and claims the benefit of priority from Japanese Patent Application No. 2019-166284, filed on Sep. 12, 2019; the entire contents of which are incorporated herein by reference.

FIELD

Embodiments described herein relate generally to a substrate bonding apparatus.

BACKGROUND

A substrate bonding apparatus sucks two substrates by two suction stages to bond the two substrates. At this time, it is desired to properly bond the two substrates.

BRIEF DESCRIPTION OF THE DRAWINGS

FIGS. 1A to 1C are views illustrating a configuration of a substrate bonding apparatus according to a first embodiment;

FIG. 6 is a flowchart illustrating an operation of the substrate bonding apparatus according to the first embodiment;

FIGS. 8A and 8B are views illustrating measurement results of marking patterns in the first embodiment;

FIGS. 9A to 9D are plan views illustrating a configuration of a pressing member in a modification example of the first embodiment;

FIGS. 10A and 10B are views illustrating a configuration of a substrate bonding apparatus according to a second embodiment;

FIG. 11 is a flowchart illustrating an operation of the substrate bonding apparatus according to the second embodiment.

DETAILED DESCRIPTION

Figure 2A:
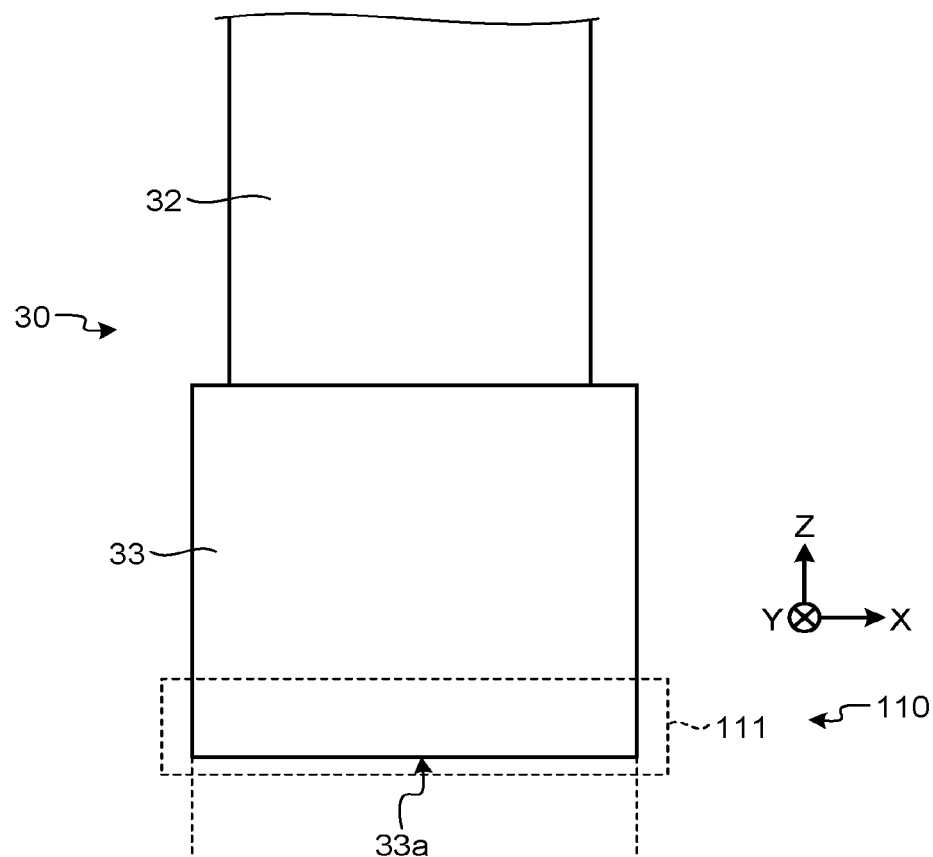
FIGS. 2A and 2B are a side view and a bottom view illustrating a configuration of a pressing member in the first embodiment.

In general, according to one embodiment, there is provided a substrate bonding apparatus including a first suction stage, a second suction stage, and a pressing member. The first suction stage sucks a first substrate. The second suction stage is arranged so as to face the first substrate. The second suction stage sucks the second substrate. The pressing member is capable of deforming the first substrate sucked on the first suction stage so as to be convex toward the second suction stage side. The pressing member has a marking structure on a distal end side.

Exemplary embodiments of a substrate bonding apparatus will be explained below in detail with reference to the accompanying drawings. The present invention is not limited to the following embodiments.

First Embodiment

A substrate bonding apparatus according to a first embodiment sucks two substrates (for example, two wafers) by two suction stages to bond the two substrates. At this time, it is desired to properly bond the two substrates.

In the bonding technique for bonding two substrates, for example, a first substrate is pressed against a second substrate side with a pressing member such as a striker to bond the two substrates. When the distribution of deviations is inspected after bonding, a peculiar deviation tends to be seen in the central part of the substrate. It is considered that this is because the first substrate is pressed with the pressing member when the substrates are bonded. As a step to solve this peculiar deviation, it is desired to first confirm whether or not the pressing member can press the first substrate vertically at a designed position with an appropriate force amount.

Therefore, in the present embodiment, in the substrate bonding apparatus, a marking structure is provided on a distal end side of the pressing member, and a marking pattern by the marking structure is measured after the two substrates are bonded, whereby a pressing position and an orientation of the pressing member can be confirmed.

Specifically, the marking structure is provided on the distal end side of the pressing member (for example, a striker) that may deform the first substrate sucked on the first suction stage so as to be convex toward the second suction stage side, and a marking portion is provided on a distal end surface of the marking structure to come into contact with the first substrate. The marking pattern of the marking portion may include a grid shape. A marking liquid is supplied to the marking portion so that marking is ready. In this state, the first substrate is sucked onto the first suction stage, and the second substrate is sucked onto the second suction stage. While the second substrate is sucked onto the second suction stage, the pressing member is protruded from the first suction stage to press the first substrate from the back surface, and the first substrate is deformed so as to be convex toward the second suction stage side to press the first substrate against the second substrate. With this operation, a joining starting point between the first substrate and the second substrate is formed. Then, the joining interface spontaneously progresses to the outer peripheral side from there. That is, when the joining starting point of hydrogen bond between hydroxyl groups is formed between the surface of the first substrate and the surface of the second substrate, the joining interface isotropically progresses from the joining starting point to the outer peripheral side and the first substrate and the second substrate are joined, so that the first substrate and the second substrate are bonded. The pressing member is retreated into the first suction stage, but a marking pattern of the marking liquid is formed on the back surface of the first substrate after the bonding. It is considered possible to confirm the actual pressing position of the pressing member and the force amount applied to the first substrate by measuring the position and line width of this marking pattern. The orientation of the pressing member may also be estimated from the distribution of the force amount. This makes it possible to confirm the pressing position and the orientation of the pressing member after the first substrate and the second substrate are bonded.

More specifically, a substrate bonding apparatus 1 may be configured as illustrated in FIG. 1A to FIG. 1C. FIG. 1A is a view illustrating a schematic configuration of the substrate bonding apparatus 1, FIG. 1B is an enlarged view illustrating a configuration of the part A of FIG. 1A, and FIG. 1C is an enlarged view illustrating a configuration of the part B of FIG. 1B.

The substrate bonding apparatus 1 includes a suction stage 10, a suction stage 20, a pressing member 30, a pipe system 40, a pipe system 50, an imaging unit 60, vacuum devices 71 to 75, a drive mechanism 80, a tilt adjusting mechanism 90, and a controller 100.

The suction stage 10 and the suction stage 20 are arranged so as to face each other when used. The suction stage 10 has a main surface 10a on the side facing the suction stage 20, and the suction stage 20 has a main surface 20a on the side facing the suction stage 10. In the following, a direction perpendicular to the main surface 20a of the suction stage 20 is defined as a Z axis, and two directions orthogonal to each other in a plane perpendicular to the Z axis are defined as an X direction and a Y direction.

The suction stage 10 can suck a substrate W1 onto the main surface 10a. The suction stage 10 includes a plate-shaped portion 11, a plurality of suction holes 12, and a through hole 13. The plate-shaped portion 11 extends in the XY directions and has a substantially plate shape. Each of the plurality of suction holes 12 extends in the Z direction and penetrates the plate-shaped portion 11. Although not illustrated, the plurality of suction holes 12 are two-dimensionally arranged in XY plan view, and are provided concentrically on the main surface 10a, for example. The suction stage 10 may vacuum-suck the substrate W1 when the plurality of suction holes 12 are controlled to be in a reduced pressure state. The through hole 13 is arranged in the central portion of the plate-shaped portion 11 in the XY direction, extends in the Z direction, and penetrates the plate-shaped portion 11. The diameter of the through hole 13 is larger than the diameter of each suction hole 12 and corresponds to the size of the portion of the pressing member 30 on the distal end side.

The suction stage 20 may suck a substrate W2 onto the main surface 20a. The suction stage 20 includes a plate-shaped portion 21 and a plurality of suction holes 22. The plate-shaped portion 21 extends in the XY directions and has a substantially plate shape. Each of the plurality of suction holes 22 extends in the Z direction and penetrates the plate-shaped portion 21. Although not illustrated, the plurality of suction holes 22 are two-dimensionally arranged in XY plan view, and are provided concentrically on the main surface 20a, for example. The suction stage 20 may vacuum-suck the substrate W2 when the plurality of suction holes 22 are controlled to be in a reduced pressure state.

The pressing member 30 moves through the through hole 13 under the control of the controller 100. For example, the pressing member 30 presses the surface of the substrate W1 on the suction side toward the suction stage 20 side in the state in which the substrate W1 is suctioned on the suction stage 10 under the control of the controller 100. As a result, the pressing member 30 deforms the substrate W1 sucked on the suction stage 10 so as to be convex toward the suction stage 20 side. The pressing member 30 may have a curved surface (for example, a spherical surface) at its distal end so that the stress applied to the substrate W1 is dispersed. The pressing member 30 is also called a striker.

As illustrated in FIG. 1C, the pressing member 30 includes a linear moving unit 31, a linear moving position adjusting unit 34, a pin 32, and a distal end portion 33. The linear moving unit 31 linearly moves the pin 32 in the Z direction. The linear moving position adjusting unit 34 may adjust in the XY directions the position of an axis Vx of the pin 32 (that is, the linear moving position in the Z direction) indicated by the alternate long and short dash line in FIG. 1C. The linear moving position adjusting unit 34 includes a guide member on which the pin 32 may slide, and may adjust in the XY directions the position of the axis Vx of the pin 32 by using the guide member. The distal end portion 33 is connected to the pin 32 on the −Z side, and the pin 32 transmits the linear movement in the Z direction by the linear moving unit 31 to the distal end portion 33. In response to this, the distal end portion 33 moves in the through hole 13 in the Z direction.

Figure 2B:
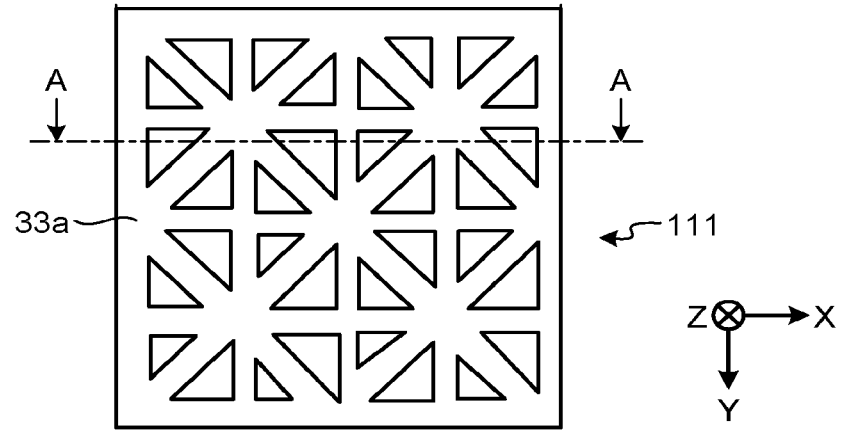
Figure 3:
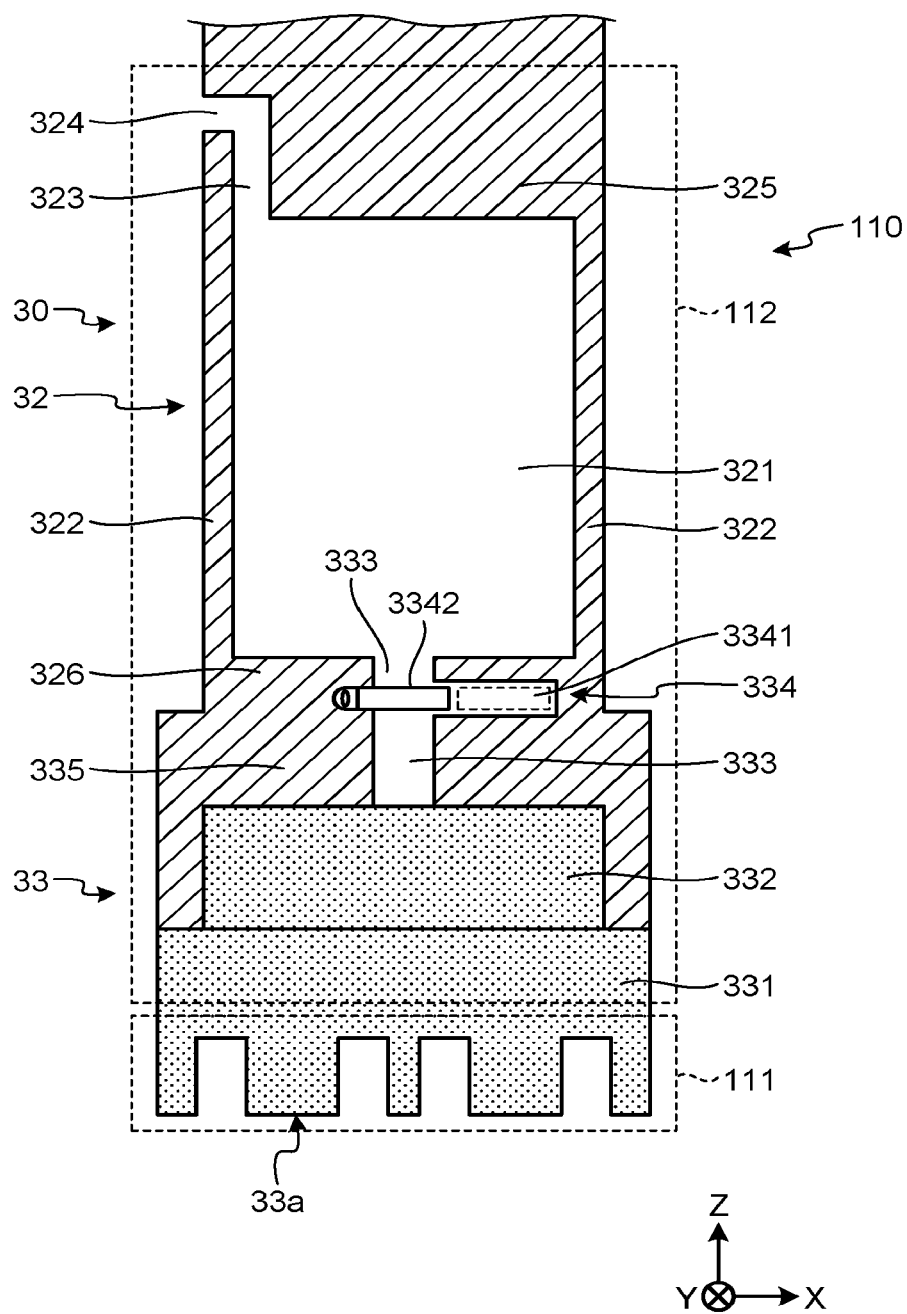
FIG. 3 is a cross-sectional view illustrating the configuration of the pressing member in the first embodiment.

The pressing member 30 has a marking structure 110 on its distal end side (−Z side). That is, the distal end portion 33 and the portion of the pin 32 on the distal end side have the marking structure 110 as illustrated in FIG. 2A, FIG. 2B, and FIG. 3. FIG. 2A is a side view of the distal end portion 33 and the portion of the pin 32 on the distal end side as viewed from the Y direction, FIG. 2B is a bottom view of the distal end portion 33 as viewed from the Z direction, and FIG. 3 is a cross-sectional view illustrating a cross section when FIG. 2B is cut along the line A-A.

The pin 32 has a substantially cylindrical shape extending in the Z direction, whereas the distal end portion 33 has a substantially rectangular parallelepiped shape. The length of the linear portion of the distal end portion 33 in the XY direction may be larger than the diameter of the pin 32.

The surface of the distal end portion 33 on the −Z side is a distal end surface to come into contact with a substrate at the time of pressing by the pressing member 30. The surface of the distal end portion 33 on the −Z side functions as a marking portion 111 having a marking pattern as illustrated in FIG. 2B, for example. The marking portion 111 is included in the marking structure 110. The marking pattern of the marking portion 111 extends in a grid shape in XY plan view. In FIG. 2B, a marking pattern in which a first grid shape pattern extending in the XY direction and a second grid shape pattern rotated by approximately 45° in the XY plane with respect to the first grid shape pattern are combined is illustrated.

In addition, the marking structure 110 has a supply unit 112 as illustrated in FIG. 3. The supply unit 112 may supply a marking liquid to the marking portion 111. The supply unit 112 includes a tank 321, a supply path 333, an opening/closing valve 334, a porous body 332, and a part of a porous body 331. The tank 321 includes a side wall portion 322, an upper wall portion 325, and a bottom wall portion 326. The tank 321 may store the marking liquid in a space formed by being surrounded by the side wall portion 322, the upper wall portion 325, and the bottom wall portion 326, and a replenishing port 324 and a replenishing path 323 communicate with the space. When the marking liquid is supplied to the tank 321 via the replenishing port 324 and the replenishing path 323, the tank 321 stores the marking liquid (also called a marking agent). As the marking liquid (marking agent), cinnabar seal ink, chemical liquid, fluorescent paint, and the like may be used.

The supply path 333 allows the space inside the tank 321 to communicate with the marking portion side (−Z side). The supply path 333 has one end connected to the tank 321 and the other end connected to the porous body 332. The supply path 333 allows the space inside the tank 321 to communicate with the cavity inside the porous body 332. The opening/closing valve 334 is arranged in the supply path 333 and opens/closes the supply path 333. The opening/closing valve 334 has a retreat space 3341 and a valve body 3342.

Under the control of the controller 100, the opening/closing valve 334 is controlled to a position where the valve body 3342 closes the supply path 333 (position indicated by the solid line in FIG. 3) in a closed state. Under the control of the controller 100, the opening/closing valve 334 is controlled to a position where the valve body 3342 is retreated from the supply path 333 to the retreat space 3341 (position indicated by the dotted line in FIG. 3) in an open state.

When the opening/closing valve 334 opens the supply path 333, the supply path 333 allows the tank 321 to communicate with the marking portion side. As a result, the marking liquid stored in the tank 321 is supplied to the marking portion 111 side via the supply path 333.

On the marking portion 111 side, the end portion of the supply path 333 on the −Z side end is connected to the porous body 332. The porous body 332 may be formed of a material having porosity and containing a first resin as a main component. The end portion of the porous body 332 on the −Z side end is connected to the porous body 331. The porous body 331 may be formed of a material having porosity and containing a second resin as a main component. The second resin is a resin having higher flexibility than the first resin. In the porous body 331, the portion on the +Z side is included in the supply unit 112 of the marking structure 110, and the portion on the −Z side is included in the marking portion 111. The portion of the porous body 331 on the −Z side (marking portion 111) is provided with a concavo-convex structure corresponding to the marking pattern illustrated in FIG. 2B.

When the marking liquid is supplied to the porous body 332 via the supply path 333, the marking liquid moves to the −Z side in the porous body 332 by a capillary force and is supplied to the portion of the porous body 331 on the +Z side. Further, the marking liquid moves inside the porous body 331 to the portion on the −Z side (marking portion 111) by the capillary force. As a result, the marking liquid is supplied to the marking portion 111.

The pipe system 40 is arranged between the plurality of suction holes 12 and the vacuum devices 71 to 73. The pipe system 40 includes exhaust pipes 41 to 43. The exhaust pipe 41 has one ends communicating with the suction holes 12 of the plurality of suction holes 12 near the central portion of the plate-shaped portion 11 in the XY direction, and the other end communicating with the inside of the vacuum device 71. The exhaust pipe 43 has one ends communicating with the suction holes 12 of the plurality of suction holes 12 on the outer peripheral sides of the plate-shaped portion 11 in the XY direction, and the other end communicating with the inside of the vacuum device 73. The exhaust pipe 42 has one ends communicating with the suction holes 12 of the plurality of suction holes 12 between the central portion and the outer peripheral sides of the plate-shaped portion 11 in the XY direction, and the other end communicating with the inside of the vacuum device 72.

The pipe system 50 is arranged between the plurality of suction holes 22 and the vacuum devices 74 and 75. The pipe system 50 includes exhaust pipes 51 and 52. The exhaust pipe 51 has one ends communicating with the suction holes 22 of the plurality of suction holes 22 near the central portion of the plate-shaped portion 21 in the XY direction, and the other end communicating with the inside of the vacuum device 74. The exhaust pipe 52 has one ends communicating with the suction holes 22 of the plurality of suction holes 22 on the outer peripheral sides of the plate-shaped portion 21 in the XY direction, and the other end communicating with the inside of the vacuum device 75.

An imaging unit 61 is arranged in the periphery of the suction stage 10, and is arranged, for example, on the −X side of the plate-shaped portion 11. Under the control of the controller 100, the imaging unit 61 may image a reference position for alignment on the joining surface of the substrate W2 that is sucked by the suction stage 20. The imaging unit 61 may include a CCD image sensor or a CMOS image sensor.

An imaging unit 62 is arranged in the periphery of the suction stage 20, and is arranged, for example, on the +X side of the plate-shaped portion 21. Under the control of the controller 100, the imaging unit 62 may image a reference position for alignment on the joining surface of the substrate W1 that is sucked by the suction stage 10. The imaging unit 62 may include a CCD image sensor or a CMOS image sensor.

Under the control of the controller 100, the vacuum device 71 may evacuate the suction holes 12 near the central portion of the plate-shaped portion 11 in the XY direction via the exhaust pipe 41 of the pipe system 40. Under the control of the controller 100, the vacuum device 72 may evacuate the suction holes 12 between the central portion and the outer peripheral sides of the plate-shaped portion 11 in the XY direction via the exhaust pipe 42 of the pipe system 40. Under the control of the controller 100, the vacuum device 73 may evacuate the suction holes 12 on the outer peripheral sides of the plate-shaped portion 11 in the XY direction via the exhaust pipe 43 of the pipe system 40. Under the control of the controller 100, the vacuum device 74 may evacuate the suction holes 22 near the central portion of the plate-shaped portion 21 in the XY direction via the exhaust pipe 51 of the pipe system 50. Under the control of the controller 100, the vacuum device 75 may evacuate the suction holes 22 on the outer peripheral sides of the plate-shaped portion 21 in the XY direction via the exhaust pipe 52 of the pipe system 50.

The drive mechanism 80 may drive the suction stage 10 and the suction stage 20 relatively in the XYZ directions under the control of the controller 100. In FIG. 1A, a configuration in which the drive mechanism 80 drives the suction stage 20 in the XYZ directions is illustrated.

The tilt adjusting mechanism 90 may adjust the tilt angle of the pressing member 30 from the Z direction in a predetermined direction. The tilt adjusting mechanism 90 is arranged near the pressing member 30 and may come into contact with the pin 32 of the pressing member 30.

Figure 4:
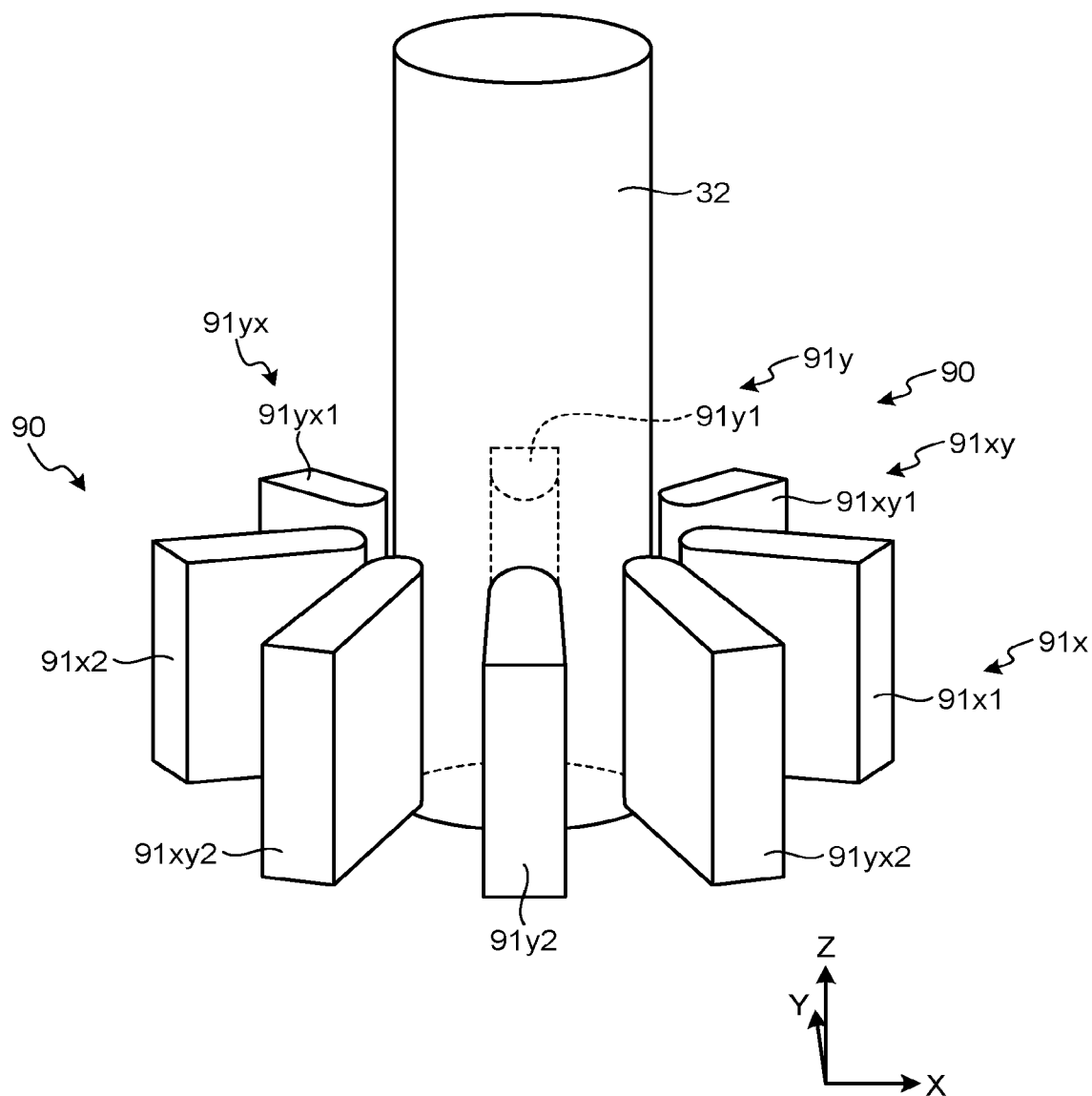
FIG. 4 is a perspective view illustrating a configuration of a tilt adjusting mechanism in the first embodiment.
Figure 5:
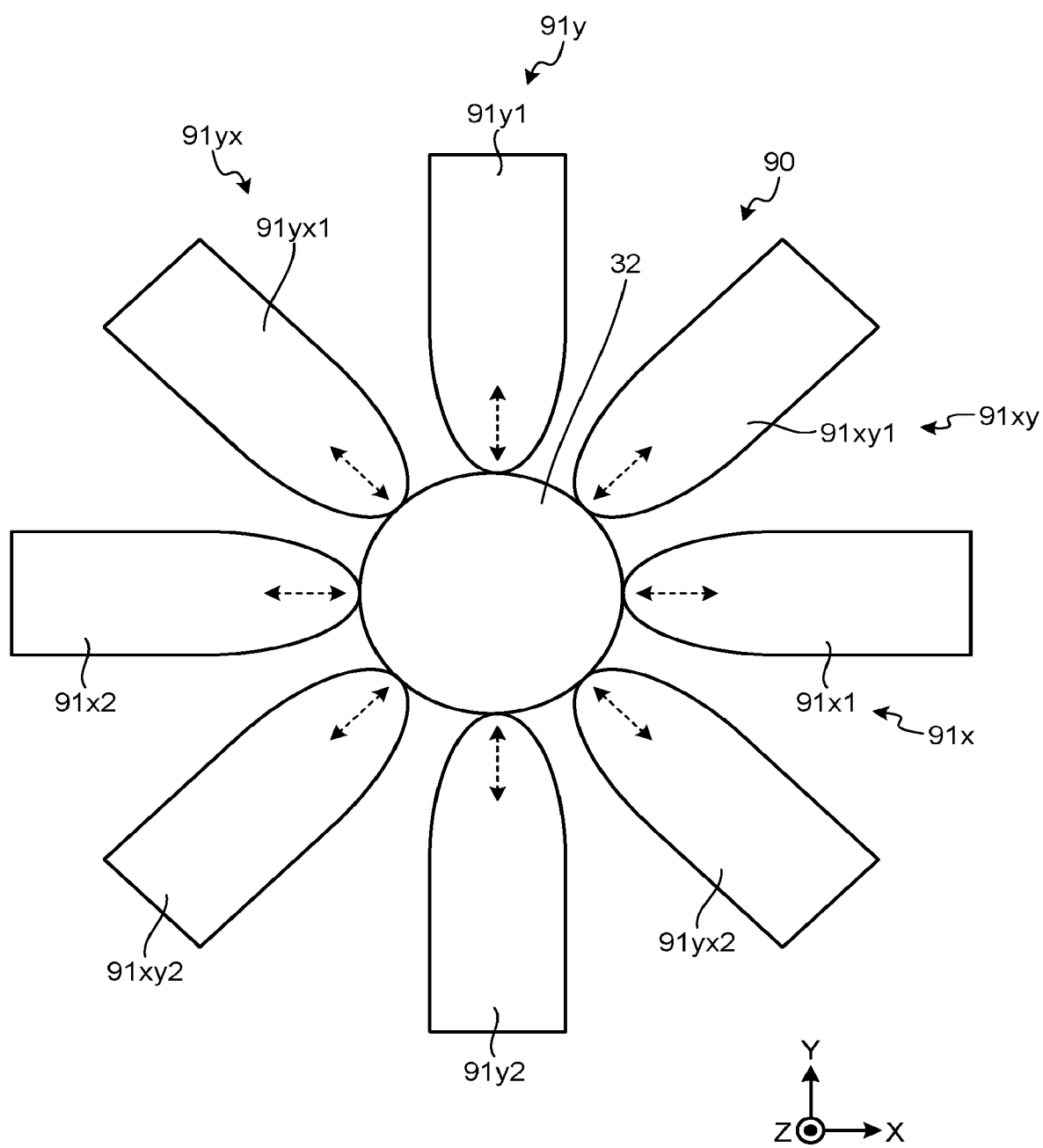
FIG. 5 is a plan view illustrating the configuration of the tilt adjusting mechanism in the first embodiment.

For example, the tilt adjusting mechanism 90 includes a plurality of drivers $91x$, $91y$, $91xy$, and $91yx$ as illustrated in FIG. 4 and FIG. 5.

The driver $91x$ may tilt the pin 32 in the X direction (for example, with the portion of the pin 32 guided by the linear moving position adjusting unit 34 as a fulcrum) under the control of the controller 100. The driver $91x$ includes a pair of drive elements $91x1$ and $91x2$, and the pair of drive elements $91x1$ and $91x2$ are interlocked to tilt the pin 32 in the X direction. The drive elements $91x1$ and $91x2$ are, for example, piezo elements, motors, solenoids, and the like. As indicated by the dotted arrows in FIG. 5, the convex portion of the drive element $91x1$ contracts in the +X direction, and the convex portion of the drive element $91x2$ extends in the +X direction, so that the pin 32 is tilted in the +X direction. The convex portion of the drive element $91x1$ extends in the −X direction, and the convex portion of the drive element 91x2 contracts in the −X direction, so that the pin 32 is tilted in the −X direction.

The driver 91y may tilt the pin 32 in the Y direction (for example, with the portion of the pin 32 guided by the linear moving position adjusting unit 34 as a fulcrum) under the control of the controller 100. The driver 91y includes a pair of drive elements 91y1 and 91y2, and the pair of drive elements 91y1 and 91y2 are interlocked to tilt the pin 32 in the Y direction. The drive elements 91y1 and 91y2 are, for example, piezo elements, motors, solenoids, and the like. As indicated by the dotted arrows in FIG. 5, the convex portion of the drive element 91y1 contracts in the +Y direction, and the convex portion of the drive element 91y2 extends in the +Y direction, so that the pin 32 is tilted in the +Y direction. The convex portion of the drive element 91y1 extends in the −Y direction, and the convex portion of the drive element 91y2 contracts in the −Y direction, so that the pin 32 is tilted in the −Y direction.

The driver 91xy may tilt the pin 32 in +X+Y direction or the −X−Y direction (for example, with the portion of the pin 32 guided by the linear moving position adjusting unit 34 as a fulcrum) under the control of the controller 100. As the definition of the oblique direction, the direction that forms 45° with respect to the X direction and the Y direction from the origin and is directed to the +X side and the +Y side is referred to as the +X+Y direction. The direction that forms 45° with respect to the X direction and the Y direction from the origin and is directed to the −X side and the −Y side is referred to as the −X−Y direction. The driver 91xy includes a pair of drive elements 91xy1 and 91xy2, and the pair of drive elements 91xy1 and 91xy2 are interlocked to tilt the pin 32 in the +X+Y direction or the −X−Y direction. The drive elements 91xy1 and 91xy2 are, for example, piezo elements, motors, solenoids, and the like. As indicated by the dotted arrows in FIG. 5, the convex portion of the drive element 91xy1 contracts in the +X+Y direction, and the convex portion of the drive element 91xy2 extends in the +X+Y direction, so that the pin 32 is tilted in the +X+Y direction. The convex portion of the drive element 91xy1 extends in the −X−Y direction, and the convex portion of the drive element 91xy2 contracts in the −X−Y direction, so that the pin 32 is tilted in the −X−Y direction.

The driver 91yx may tilt the pin 32 in the −X+Y direction or the +X−Y direction (for example, with the portion of the pin 32 guided by the linear moving position adjusting unit 34 as a fulcrum) under the control of the controller 100. As the definition of the oblique direction, the direction that forms 45° with respect to the X direction and the Y direction from the origin and is directed to the −X side and the +Y side is referred to as the −X+Y direction. The direction that forms 45° with respect to the X direction and the Y direction from the origin and is directed to the +X side and the −Y side is referred to as the +X−Y direction. The driver 91yx includes a pair of drive elements 91yx1 and 91yx2, and the pair of drive elements 91yx1 and 91yx2 are interlocked to tilt the pin 32 in the −X+Y direction or the +X−Y direction. The drive elements 91yx1 and 91yx2 are, for example, piezo elements, motors, solenoids, and the like. As indicated by the dotted arrows in FIG. 5, the convex portion of the drive element 91yx1 contracts in the −X+Y direction, and the convex portion of the drive element 91yx2 extends in the −X+Y direction, so that the pin 32 is tilted in the −X+Y direction. The convex portion of the drive element 91yx1 extends in the +X−Y direction, and the convex portion of the drive element 91yx2 contracts in the +X−Y direction, so that the pin 32 is tilted in the +X−Y direction.

Next, the operation of the substrate bonding apparatus 1 will be described with reference to FIG. 6 and FIG. 7A to FIG. 7D. FIG. 6 is a flowchart illustrating the operation of the substrate bonding apparatus 1. FIG. 7A to FIG. 7D are views illustrating the operation of the substrate bonding apparatus 1.

In the substrate bonding apparatus 1, when the substrate W1 to be sucked on the suction stage 10 is loaded by a transfer system, the controller 100 recognizes a notch that serves as a reference for the orientation of the substrate W1. The controller 100 performs notch alignment adjustment of the substrate W1, determines the orientation of the substrate W1, then reverses the front and back surfaces of the substrate W1 (S1), controls the vacuum devices 71 to 73, and causes the suction stage 10 to suck and hold the substrate W1 (S2).

In parallel with this operation, when the substrate W2 to be sucked on the suction stage 20 is loaded by the transfer system, the controller 100 recognizes a notch that serves as a reference for the orientation of the substrate W2. The controller 100 performs notch alignment adjustment of the substrate W2, determines the orientation of the substrate W2 (S3), controls the vacuum devices 74 to 75, and causes the suction stage 20 to suck and hold the substrate W2 (S4).

Figure 7A:
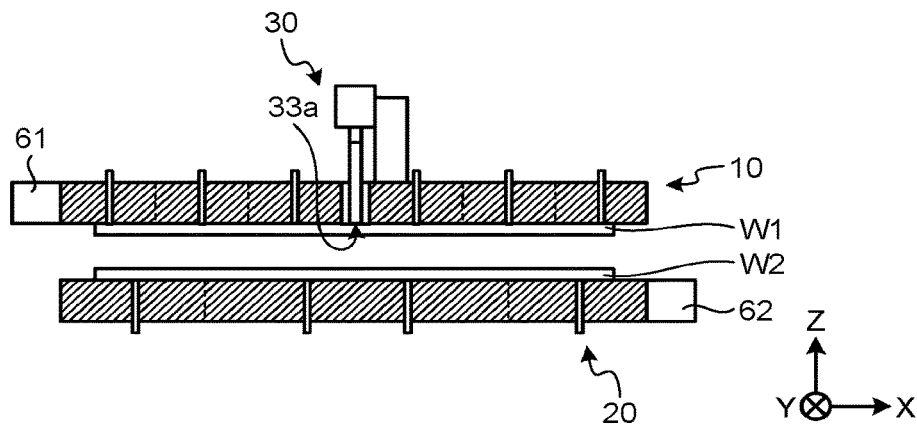
FIGS. 7A to 7D are views illustrating the operation of the substrate bonding apparatus according to the first embodiment.

When both the processes of S2 and S4 are completed, the controller 100 uses the imaging units 61 and 62 to perform alignment adjustment between the substrate W1 sucked by the suction stage 10 and the substrate W2 sucked by the suction stage 20 (S5) so that the substrate W1 and the substrate W2 are arranged so as to face each other as illustrated in FIG. 7A.

The controller 100 opens and closes the opening/closing valve 334 in the marking structure 110 to fill a distal end surface 33a of the pressing member (striker) 30 with the marking agent (S6).

Figure 7B:
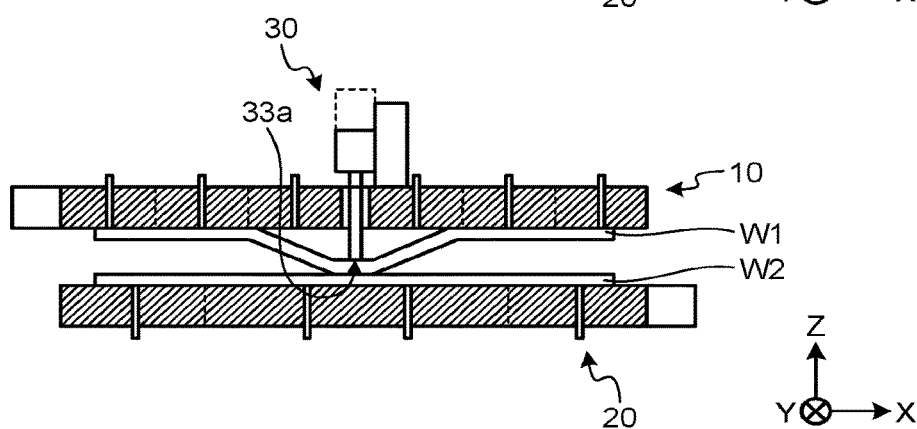

The controller 100 controls the pressing member 30 so that the distal end surface 33a of the pressing member 30 pushes the vicinity of the central portion of the substrate W1 toward the suction stage 20 side (−Z side) as illustrated in FIG. 7B. At this time, the marking pattern of the marking structure 110 is formed on the surface of the substrate W1 on +Z side at the contact position with the distal end surface 33a of the pressing member 30. Further, the bonding of the substrates W1 and W2 is started in such a manner that the substrate W1 is brought into contact with the substrate W2 while being deformed so that the vicinity of the central portion of the substrate W1 is convex toward the substrate W2 side (S7).

Figure 7C:
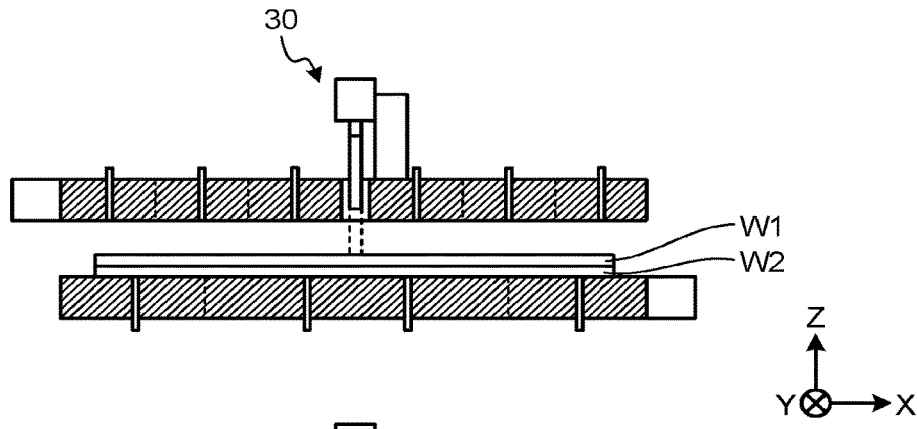

When the bonding of the substrates W1 and W2 is completed, the controller 100 controls the pressing member 30 to retreat so that the distal end surface 33a of the pressing member 30 moves away from the surface of the substrate W1 on the +Z side to the +Z side as illustrated in FIG. 7C.

Figure 7D:
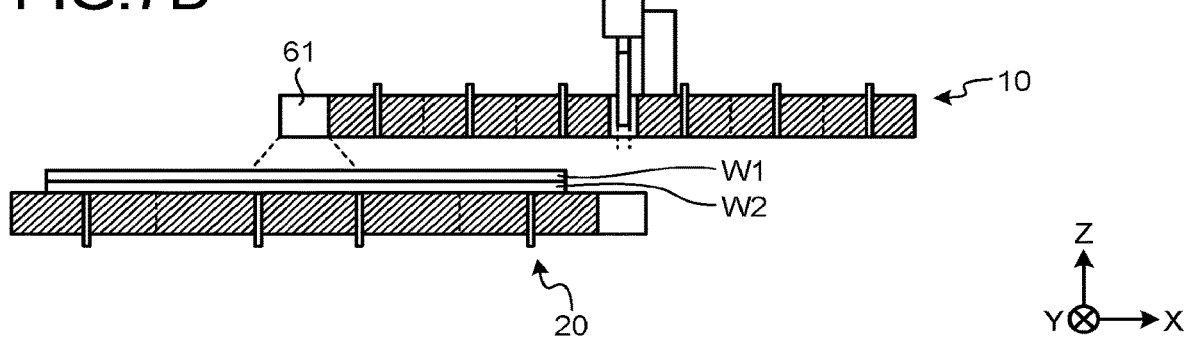

The controller 100 controls the drive mechanism 80 to relatively drive the suction stage 10 and the suction stage 20 so that the vicinity of the central portion of the substrate W1 is located on the −Z side of the imaging unit 61 as illustrated in FIG. 7D. The controller 100 uses the imaging unit 61 to obtain an image of the marking pattern formed near the central portion of the surface of the substrate W1 on the +Z side, measures the marking pattern (S8), and determine the adjustment amount of the position and tilt angle of the pressing member 30.

In the controller 100, information on the target position on the surface of the substrate W1 on the +Z side with which the pressing member 30 is to come into contact is preset. The controller 100 determines the deviation of the XY position of the pressing member 30 from the target position based on the image of the marking pattern. Further, the controller 100 determines the tilt angle of the pressing member 30 from the Z direction based on the image of the marking pattern.

For example, when the image of the marking pattern as illustrated in FIG. 8A is acquired, it may be estimated that the axis Vx of the pin 32 of the pressing member 30 is tilted in the −X+Y direction, and since the part of the marking pattern on the −X+Y side is missing, it can be estimated that the angle of tilt is θ1 which is relatively large. In response thereto, the controller 100 can set the tilt adjustment amount to an amount corresponding to the estimated amount in the direction opposite to the estimated tilt. For example, the controller 100 may set the tilt adjustment amount to θ1 in the +X−Y direction.

Alternatively, when the image of the marking pattern as illustrated in FIG. 8B is acquired, it may be estimated that the axis Vx of the pin 32 of the pressing member 30 is tilted in the +X direction, and since there is no part missing in the marking pattern, it may be estimated that the angle of tilt is θ2 (<θ1), which is relatively small. In response thereto, the controller 100 may set the tilt adjustment amount to an amount corresponding to the estimated amount in the direction opposite to the estimated tilt. For example, the controller 100 may set the tilt adjustment amount to θ2 in the −X direction.

The controller 100 adjusts the position and tilt angle of the pressing member 30 with the adjustment amount of the position and tilt angle determined in S8 (S9). The controller 100 controls the linear moving position adjusting unit 34 of the pressing member 30 to adjust the XY position of the axis Vx of the pin 32 with the adjustment amount of the position determined in S8. Further, the controller 100 controls the tilt adjusting mechanism 90 to adjust the tilt angle of the axis Vx of the pin 32 from the Z direction with the adjustment amount of the tilt angle determined in S8. For example, when the image of the marking pattern is the image illustrated in FIG. 8A, the controller 100 adjusts in the +X−Y direction the tilt angle of the axis Vx of the pin 32 from the Z direction with θ1. For example, when the image of the marking pattern is the image illustrated in FIG. 8B, the controller 100 adjusts in the −X direction the tilt angle of the axis Vx of the pin 32 from the Z direction by θ2. With this, in the state in which the pressing member 30 is properly adjusted, thereafter, the two substrates may be bonded by the substrate bonding apparatus 1.

As described above, in the present embodiment, in the substrate bonding apparatus 1, the marking structure 110 is provided on the distal end side of the pressing member 30, and after the two substrates W1 and W2 are bonded, the marking pattern of the marking portion 111 of the marking structure 110 is measured. With this configuration, the pressing position and the orientation of the pressing member 30 may be confirmed, and the pressing position and the orientation of the pressing member 30 may be adjusted to be appropriate. As a result, it is possible to provide the substrate bonding apparatus 1 suitable for properly bonding the two substrates.

Further, in the present embodiment, the marking portion 111 of the marking structure 110 has a shape that is angled toward the direction adjustable by the tilt adjusting mechanism 90. Further, the marking pattern of the marking portion 111 includes a pattern extending toward the direction adjustable by the tilt adjusting mechanism 90. With this configuration, the marking portion 111 may efficiently pick up the bias of the stress when the distal end surface 33a of the pressing member 30 comes into contact with the substrate in the direction in which the tilt angle is adjustable. As a result, the orientation of the pressing member 30 may be efficiently adjusted.

Note that, the marking pattern of the marking structure 110 is not limited to the pattern illustrated in FIG. 2B. For example, the marking pattern of the marking structure 110 may be a pattern extending radially from the center in XY plan view as illustrated in FIG. 9A, or a pattern extending in a grid shape in the X direction and the Y direction in XY plan view as illustrated in FIG. 9B. Further, the marking pattern of the marking structure 110 may be a pattern extending in a cross shape in the oblique direction in XY plan view as illustrated in FIG. 9C, or a pattern extending in a grid shape in the oblique direction in XY plan view as illustrated in FIG. 9D. These marking patterns also include a pattern extending toward the direction adjustable by the tilt adjusting mechanism 90, so that the bias of the stress when the distal end surface 33a of the pressing member 30 comes into contact with the substrate may be efficiently picked up in the direction in which the tilt angle is adjustable.

Note that, as indicated by the dotted line in FIG. 1A, the substrate bonding apparatus 1 may include a stage 85 for trial pressing position accuracy confirmation. The stage 85 for trial pressing position accuracy confirmation is a place for easily confirming the pressing position accuracy of the pressing member (striker) 30 not when the pressing member 30 is pressed onto the substrate but when the device is adjusted. With this configuration, the deviation of the pressing position and the deviation of the orientation of the pressing member 30 may be roughly confirmed before the confirmation using the substrate.

Second Embodiment

Next, a substrate bonding apparatus 201 according to a second embodiment will be described. In the following, parts that are different from the first embodiment are mainly described.

In the first embodiment, the marking liquid is supplied to the marking portion 111 by the supply from the tank 321 in the pressing member 30, but in the second embodiment, the marking liquid is supplied to the marking portion 111 by coating the marking liquid on the marking portion 111.

Specifically, the substrate bonding apparatus 201 may be configured as illustrated in FIG. 10A and FIG. 10B. FIG. 10A is a view illustrating a schematic configuration of the substrate bonding apparatus 201, and FIG. 10B is an enlarged view illustrating a configuration of the part C of FIG. 10A.

The substrate bonding apparatus 201 includes a pressing member 230 and a controller 200 instead of the pressing member 30 and the controller 100 (see FIG. 1A to FIG. 1C), and further includes a coater 295. The pressing member 230 has a structure in which the supply unit 112 (see FIG. 3) is omitted from the marking structure 110 provided on the distal end side (−Z side) thereof. The coater 295 is arranged in the periphery of the suction stage 20, and is arranged, for example, on the −X side of the plate-shaped portion 21. The coater 295 includes a marking agent coating base 295a and side wall portions 295b and 295c. In the coater 295, the upper surface of the marking agent coating base 295a is slightly lower in Z height than the end portions of the side wall portions 295b and 295c on the +Z side. With this configuration, the marking liquid may be stored in the space surrounded by the marking agent coating base 295a and the side wall portions 295b and 295c. In the coater 295, the marking liquid to be coated on the distal end surface 33a of the pressing member 230 (the marking portion 111 of the marking structure 110) is stored on the marking agent coating base 295a, and when the distal end surface 33a of the pressing member 230 comes close to or comes into contact with the marking agent coating base 295a, the coater 295 coats the marking liquid on the marking portion 111.

Figure 12A:
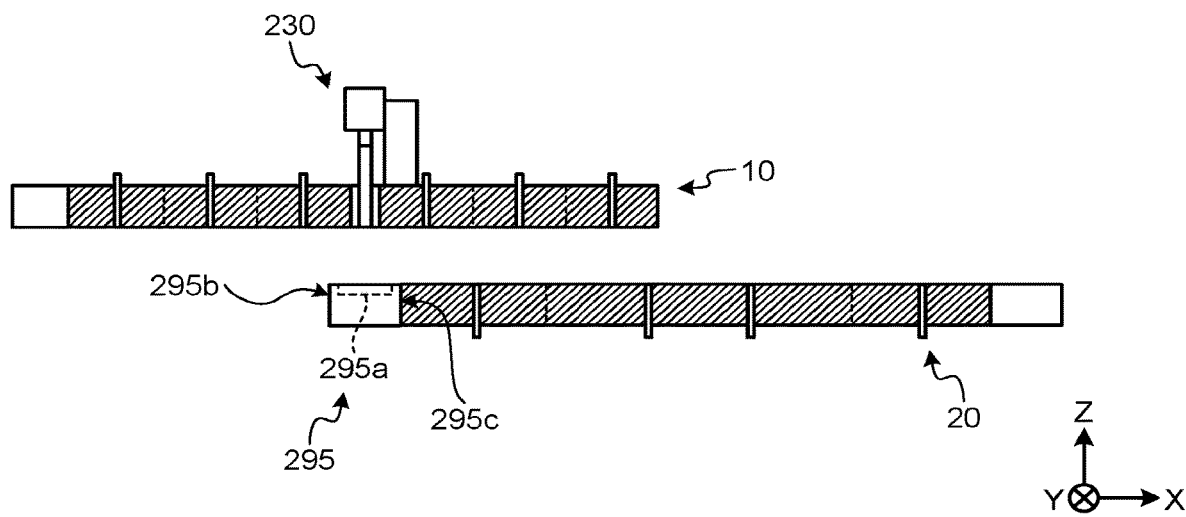
FIGS. 12A and 12B are views illustrating an operation of the substrate bonding apparatus according to the second embodiment.
Figure 12B:
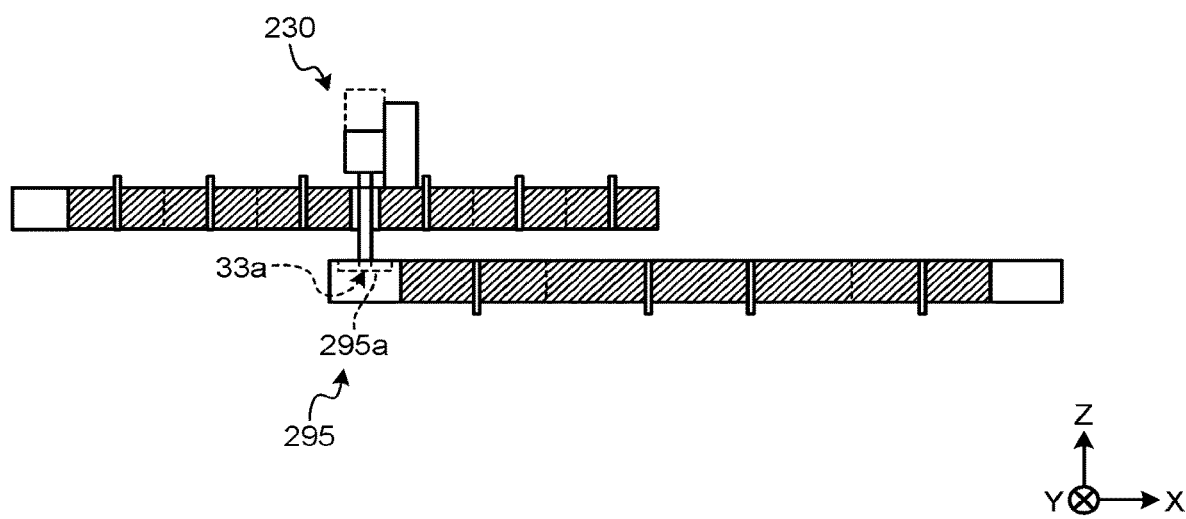

Further, as illustrated in FIG. 11, FIG. 12A, and FIG. 12B, the substrate bonding apparatus 201 operates differently from the first embodiment in the following points. FIG. 11 is a flowchart illustrating the operation of the substrate bonding apparatus 201. FIG. 12A and FIG. 12B are views illustrating the operation of the substrate bonding apparatus 201.

In the substrate bonding apparatus 201, the controller 200 coats the marking liquid on the marking portion 111 before the substrate W1 to be sucked onto the suction stage 10 is loaded by the transfer system or when the substrate W1 to be sucked onto the suction stage 10 waits at a position at which the substrate W1 may be loaded by the transfer system.

For example, as illustrated in FIG. 12A, the controller 200 controls the drive mechanism 80 to relatively drive the suction stage 10 and the suction stage 20 in the XY directions so that the coater 295 is located on the −Z side of the pressing member 230.

Then, as illustrated in FIG. 12B, the controller 200 controls the pressing member 230 to bring the distal end surface 33a of the pressing member 230 into contact with the marking agent coating base 295a of the coater 295 (S11). With this configuration, the controller 200 coats the marking liquid (marking agent) on the marking portion 111.

After that, the controller 200 performs S1 and S2. The controller 200 performs S3 and S4 in parallel with S11, S1, and S2. The controller 200 performs S5 and S7 to S9 when both the processes of S2 and S4 are completed. With this operation, in the state in which the pressing member 230 is properly adjusted, thereafter, the two substrates may be bonded by the substrate bonding apparatus 201.

As described above, in the present embodiment, in the substrate bonding apparatus 201, the marking liquid is supplied to the marking portion 111 by coating the marking liquid on the marking portion 111 from the coater 295. Also with such a configuration, the pressing position and the orientation of the pressing member 230 may be confirmed, and the pressing position and the orientation of the pressing member 230 may be adjusted to be appropriate. Moreover, the structure of the pressing member 230 may be simplified, and the cost of the substrate bonding apparatus 201 may be reduced.

(Supplementary Note 1)
A substrate bonding apparatus including:
a first suction stage that sucks a first substrate;
a second suction stage that is arranged so as to face the first substrate and sucks a second substrate; and
a pressing member that may deform the first substrate sucked on the first suction stage so as to be convex toward the second suction stage side and has a marking structure on a distal end side.

(Supplementary Note 2)
The substrate bonding apparatus according to the supplementary note 1, in which
the marking structure includes a marking portion having a marking pattern on a distal end surface to come into contact with the first substrate.

(Supplementary Note 3)
The substrate bonding apparatus according to the supplementary note 2, in which
the marking pattern extends in a grid shape, in a cross shape, or radially in plan view.

(Supplementary Note 4)
The substrate bonding apparatus according to the supplementary note 2, further including
an adjusting mechanism that adjusts a tilt angle of the pressing member from a normal line of a surface of the second suction stage in a predetermined direction,
in which the marking portion has a shape that is angled toward the predetermined direction in plan view.

(Supplementary Note 5)
The substrate bonding apparatus according to the supplementary note 4, in which
the marking pattern has a rectangular outer contour in plan view, and extends in a grid shape along sides of the outer contour.

(Supplementary Note 6)
The substrate bonding apparatus according to the supplementary note 4, in which
the marking pattern has a rectangular outer contour in plan view, and extends in a grid shape along diagonal lines of the outer contour.

(Supplementary Note 7)
The substrate bonding apparatus according to the supplementary note 4, in which
the marking pattern extends in a grid shape, in a cross shape, or radially so as to include a pattern along the predetermined direction in plan view (Supplementary Note 8)
The substrate bonding apparatus according to any one of the supplementary notes 2 to 7, in which
the marking structure further includes a supply unit that supplies a marking liquid to the marking portion.

(Supplementary Note 9)
The substrate bonding apparatus according to the supplementary note 8, in which
the supply unit includes:
a tank that stores the marking liquid;
a supply path that allows the tank to communicate with the marking portion side; and
an opening/closing valve that opens and closes the supply path.

(Supplementary Note 10)
The substrate bonding apparatus according to any one of the supplementary notes 2 to 7, further including
a coater that coats the marking liquid on the marking portion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A substrate bonding apparatus comprising:
a first suction stage that sucks a first substrate;
a second suction stage that is arranged so as to face the first substrate and that sucks a second substrate;
a pressing member that is capable of deforming the first substrate sucked on the first suction stage so as to be convex toward the second suction stage side and that has a marking structure on a distal end side, the marking structure including a marking portion on a distal end surface, the marking portion having a marking pattern, and the distal end surface being a surface to come into contact with the first substrate; and a coater having a space configured to store a marking liquid to be coated on the marking portion.

2. The substrate bonding apparatus according to claim 1, wherein the marking pattern extends in a grid shape in plan view.

3. The substrate bonding apparatus according to claim 1, wherein the marking pattern extends in a cross shape in plan view.

4. The substrate bonding apparatus according to claim 1, wherein the marking pattern extends radially in plan view.

5. The substrate bonding apparatus according to claim 1, further comprising an adjusting mechanism that adjusts a tilt angle of the pressing member from a normal line of a surface of the second suction stage in a predetermined direction, wherein the marking portion has a shape that is angled toward the predetermined direction in plan view.

6. The substrate bonding apparatus according to claim 5, wherein the marking pattern has a rectangular outer contour in plan view, and the marking pattern extends in a grid shape along sides of the outer contour.

7. The substrate bonding apparatus according to claim 5, wherein the marking pattern has a rectangular outer contour in plan view, and the marking pattern extends in a grid shape along diagonal lines of the outer contour.

8. The substrate bonding apparatus according to claim 5, wherein the marking pattern extends in a grid shape so as to include a pattern along the predetermined direction in plan view.

9. The substrate bonding apparatus according to claim 5, wherein the marking pattern extends in a cross shape so as to include a pattern along the predetermined direction in plan view.

10. The substrate bonding apparatus according to claim 5, wherein the marking pattern extends radially so as to include a pattern along the predetermined direction in plan view.

11. The substrate bonding apparatus according to claim 5, wherein a distal end portion of the pressing member is supported by a pin, and the adjusting mechanism includes:

a first driver that is capable of tilting the pin in a first direction; and a second driver that is capable of tilting the pin in a second direction.

12. The substrate bonding apparatus according to claim 1, wherein the coater includes:

side wall portions; and a coating base, and the side wall portions and the coating base surround the space.

13. The substrate bonding apparatus according to claim 12, wherein an upper surface of the coating base is lower than upper ends of the side wall portions.

* * * * *